(12) United States Patent
Brady

(10) Patent No.: US 6,243,305 B1
(45) Date of Patent: Jun. 5, 2001

(54) MEMORY REDUNDANCY DEVICE AND METHOD

(75) Inventor: James Brady, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/303,221

(22) Filed: Apr. 30, 1999

(51) Int. Cl.$^7$ ........................................................ G11C 7/00
(52) U.S. Cl. ................ 365/200; 365/185.09; 365/225.7; 365/240
(58) Field of Search ................ 365/200, 185.09, 365/225.7, 230.04, 240

(56) References Cited

U.S. PATENT DOCUMENTS

| | | | |
|---|---|---|---|
| 4,598,388 | * 7/1986 | Anderson | 365/200 |
| 5,537,665 | * 7/1996 | Pate et al. | 395/182.03 |
| 5,764,587 | 6/1998 | Buettner et al. | 365/230.06 |
| 5,801,986 | * 9/1998 | Matsumoto et al. | 365/185.09 |
| 5,953,267 | * 9/1999 | Oh | 365/200 |
| 5,963,489 | * 10/1999 | Kirihata et al. | 365/200 |

FOREIGN PATENT DOCUMENTS 0 795 825 A2   9/1997  (EP) .
WO 98/28746    7/1998  (WO) .

OTHER PUBLICATIONS

European Search Report dated Sept. 5, 2000 completed on Aug. 29, 2000, EP 00 30 3618.

* cited by examiner

Primary Examiner—Richard Elms
Assistant Examiner—Tuan T. Nguyen
(74) Attorney, Agent, or Firm—Theodore E Galanthay; Lisa K. Jorgenson; Andre Szuwalski

(57) ABSTRACT

A redundant circuit and method for a semiconductor memory device is disclosed. The redundant circuit includes a programmable circuit for selectively generating at least one first address corresponding to a defective memory row or column line, and shifter circuitry for remapping second addresses which are greater than the first address to row/column lines. For each second address which is greater than the first address, the shifter circuitry remaps the second address to a row/column line which was initially mapped to an immediately higher address relative to the second address. The programmable circuit is capable of generating a plurality of first addresses corresponding to a plurality of defective memory row or column lines.

29 Claims, 6 Drawing Sheets

MEMORY REDUNDANCY DEVICE AND METHOD

BACKGROUND OF THE INVENTION

1. Technical Field of the Invention

The present invention relates to redundancy circuitry for semiconductor memory devices, and particularly to row/column redundancy circuitry for random access memory (RAM) devices.

2. Background and Objects of the Invention

Processing defects in static random access memory (SRAM) and dynamic random access memory (DRAM) devices can significantly reduce the processing yield in large scale memory arrays. In order to improve the processing yield of memory chips, various methods of error correction have been created. These include 'soft' error correcting whereby software corrects for physical defects, and 'hard' error correcting whereby defective circuit elements are replaced with redundant elements included on the chip. The use of soft or hard error correcting can result in lower chip manufacturing costs and earlier introduction of new products on existing wafer fabrication lines or in new process technologies.

Yield enhancement by 'hard' error correcting on a memory chip is typically produced by including redundant rows and/or columns within the memory array. A few redundant rows or columns can significantly enhance yield of a memory circuit since many devices are rejected for single bit failure or failures in a single row or column. These redundant rows or columns can be added to the memory design to replace defective rows or columns which are identified at electrical test after wafer processing.

To replace a defective memory row or column, the defective row or column is first disconnected from the array. This is accomplished by one of three methods: current blown fuses, laser blown fuses, and laser annealed resistor connections. Then a redundant row or column is enabled and programmed with the defective row or column address.

Because any row or column of the memory array may be associated with a manufacturing defect, the above-described procedures for replacing a defective row or column line is conventionally carried out by providing a distinct fuse element for each row or column line. A problem exists, however, concerning the layout of the fuse elements and the memory array in that the fuse elements are large relative to the dimensions of a memory cell such that the pitch of a fuse element is generally greater than the column or row pitch for memory devices utilizing today's advanced fabrication techniques. Placing fuse elements on the column pitch has thus led to a number of compromises. One compromise, which includes replacing a number of row or column lines when only one row or column line needs to be replaced, requires the fabrication of more redundant row or column lines than would otherwise be needed. As a result, there exists a need for an improved method and circuit for replacing column or row lines in a memory device.

SUMMARY OF THE INVENTION

The present invention overcomes the shortcomings associated with prior redundancy architectures for memory devices and satisfies a significant need for a circuit and method for replacing defective row or column lines in a semiconductor memory device.

According to the present invention, there is provided a redundant circuit and method for a memory device having a plurality of row and column lines, including a programmable circuit for indicating at least one row or column line having a defect and a shifter circuit for shifting the memory addresses to bypass the at least one indicated defective row or column line. In particular, the shifter circuit modifies the address mapping for the row or column lines initially mapped to address values which are greater than the address value corresponding to the defective row or column line indicated by the programmable circuit. For each row or column line initially mapped to an address value which is greater than the address value corresponding to the defective row or column line, the shifter circuit maps a new address value to the row or column line which is one less than the address value initially mapped thereto. The highest numbered address values are mapped to a redundant row or column line. In this way, the defective row or column line is effectively bypassed.

A primary advantage of the present invention is that fuse elements in the programmable circuitry which may be utilized to indicate a defective row or column line are not coupled to the row or column line of the memory device. Instead, the programmable circuitry may be located in an area more peripherally located relative to the memory array.

In a first preferred embodiment of the present invention, the programmable circuitry is capable of indicating more than one defective row or column line in the memory device. Following the indication of at least two defective row or column lines in the memory device, for each row or column line initially mapped to an address value which is greater than a first address value corresponding to a first defective row or column line but less than a second address value corresponding to a second defective row or column line, the shifter circuit maps an address value to the row or column line which is one less than the address value initially mapped thereto. In addition, for each row or column line initially mapped to an address value which is greater than the second address value, the shifter circuit maps an address value to the row or column line which is two less than the address value initially mapped thereto. In this way, the address values which are greater than the first address value but less than the second address value are mapped to at least a next higher row or column line, and the address values which are greater than the second address value are twice shifted to higher row or column lines. The highest two address values are each mapped to a redundant row or column line. Consequently, both the first and second defective row or column lines are effectively bypassed.

In the first preferred embodiment of the present invention described above, the address value corresponding to a defective row or column line, generated by the programmable circuitry, is static so that an entire column or row line associated with at least one defect is permanently bypassed. In a second preferred embodiment of the present invention, the address value corresponding to a defective column line is dynamically generated in order to bypass the column line only when a previously discovered defective memory cell is to be accessed. In this way, a single redundant column line may be utilized to bypass defective memory cells associated with different column lines.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

Figure 1:
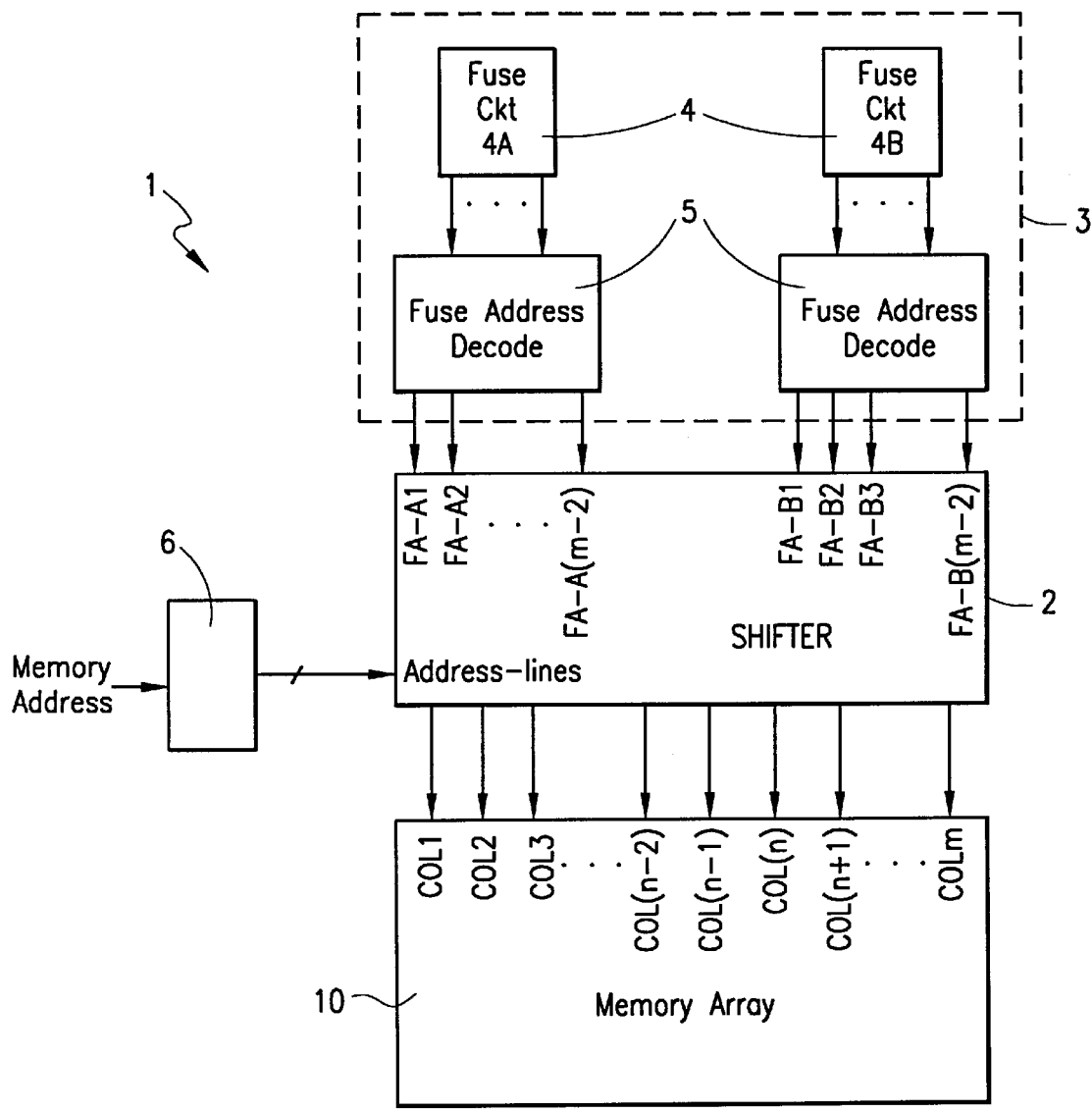
FIG. 1 is a block diagram of a memory redundancy device according to a preferred embodiment of the present invention in association with various components of a memory device.
Figure 2:
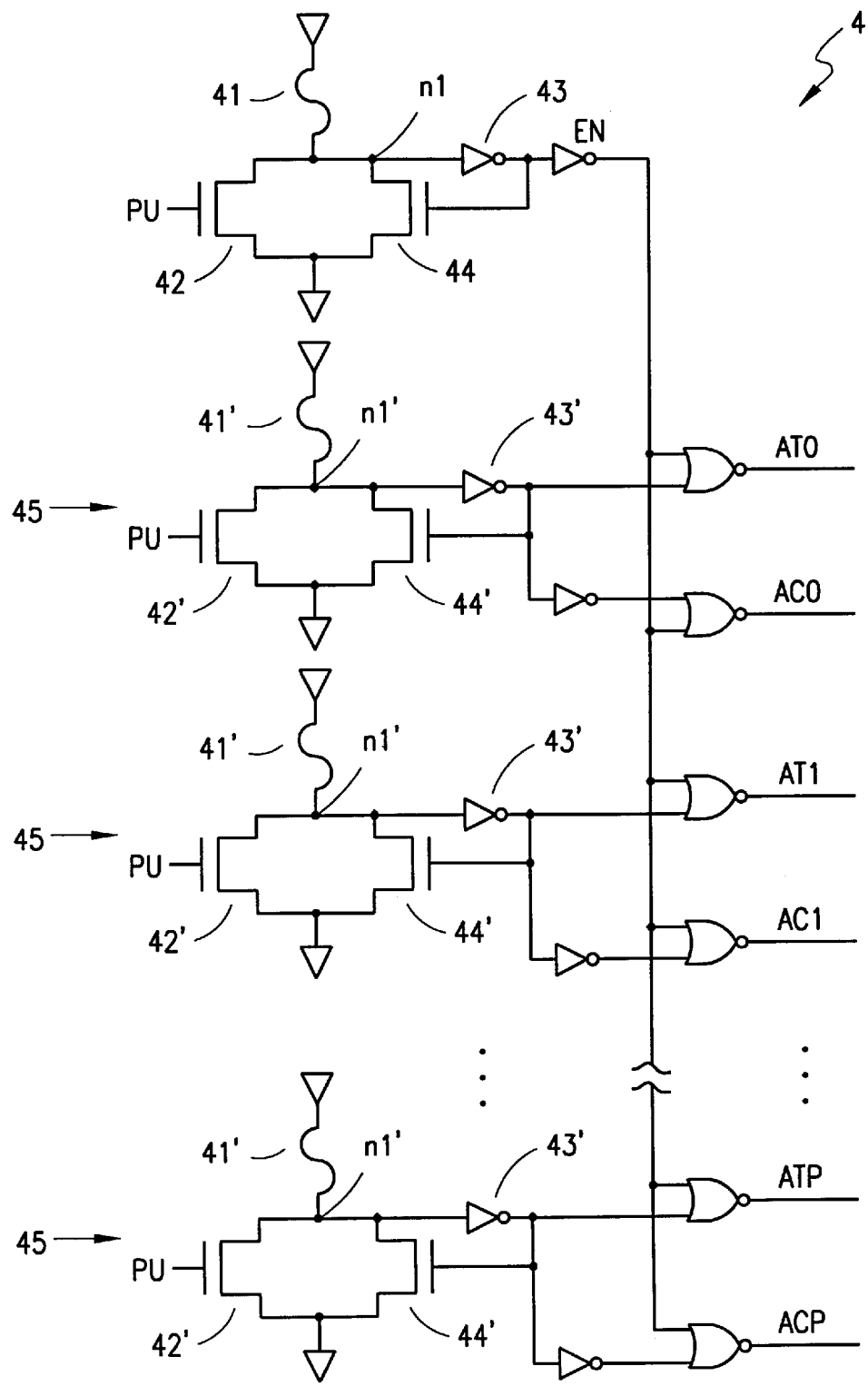
FIG. 2 is a schematic diagram of a fuse circuit according to a preferred embodiment of the present invention.
Figure 3:
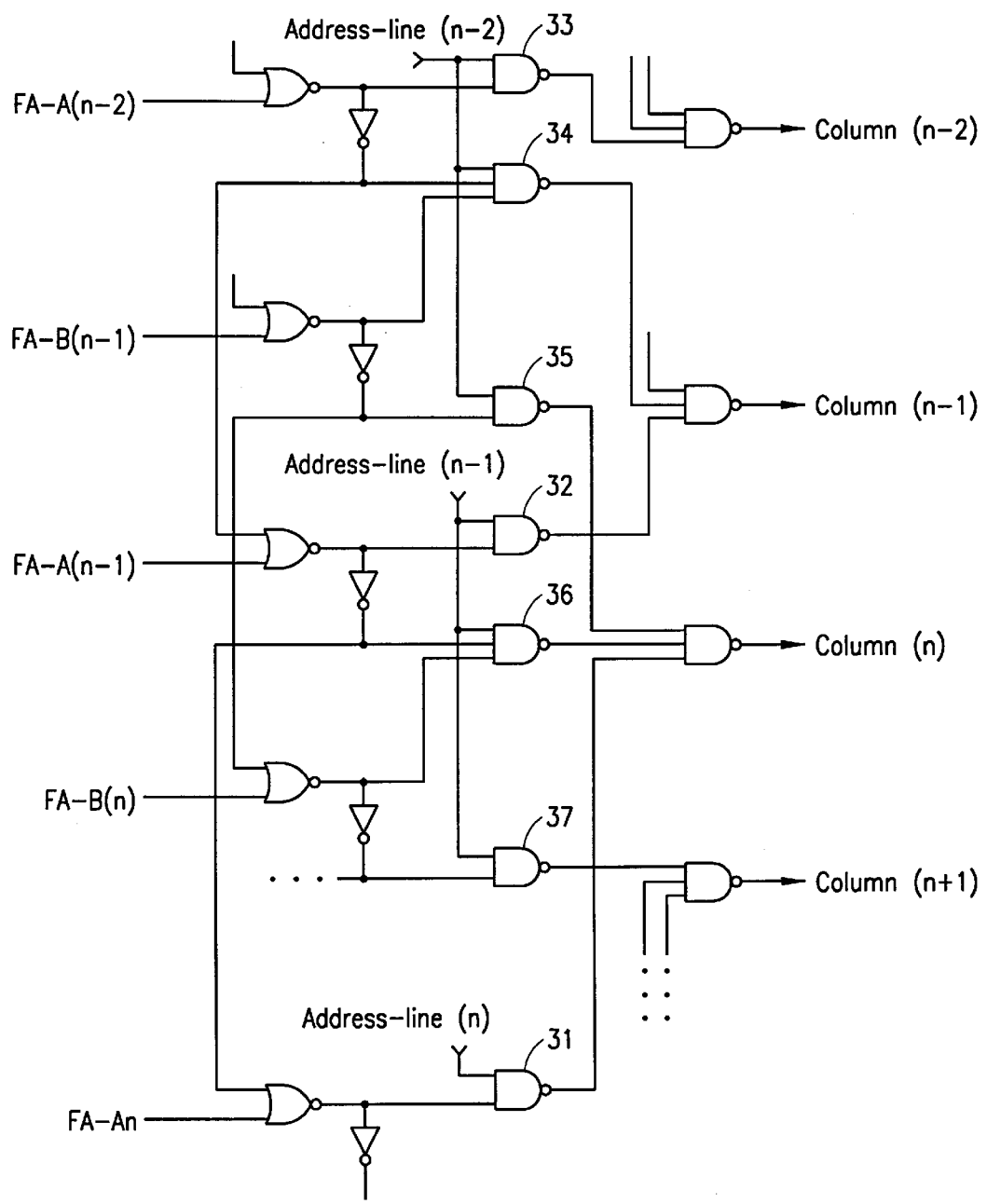
FIG. 3 is a schematic diagram of a shifter circuit according to the present invention.

Referring to FIGS. 1–3, there is shown a redundancy circuit 1 which is suitably employed to indicate and effectively bypass row or column lines associated with a defect, such as a manufacturing defect. Redundancy circuitry 1 is adapted to directly drive the row or column lines of a memory array 10. Memory array 10 includes additional (redundant) row or column lines for use upon discovery of a row or column line being associated with a defect. For purposes of simplicity, redundancy circuit 1 will be described below in conjunction with the column lines of memory array 10. It is understood that the present invention may be suitably employed to effectuate the replacement of defective memory row lines of memory array 10.

Redundancy circuit 1 preferably includes a shifter circuit 2 and a programmable circuit 3. Programmable circuit 3 is selectively programmed to indicate one or more previously discovered column lines having a defect associated therewith. Shifter circuit 2 controls the activation of the column lines to bypass the defective column line indicated by programmable circuit 3.

Shifter circuit 2 and programmable circuit 3 of redundancy circuit 1 are employable to bypass a row or column line in memory array 10 associated with a defect. For a large memory device, a plurality of shifter circuits 2 and programmable circuits 3 may be used such that each shifter circuit 2 and programmable circuit 3 combination corresponds to a distinct block of row or column lines in memory array 10.

For example, redundancy circuit 1 may be implemented to selectively bypass up to two row or column lines within a block of 128 row or column lines in memory array 10. Consequently, two redundant row or column lines would be included in memory array 10 for every block of 128 row or column lines. In this way, for a memory device requiring 1024 useable row or column lines, eight instances of redundancy circuits 1 and 16 redundant row or column lines would be implemented in the memory device. This results in a total of 1040 row or column lines in the memory device being needed to provide 1024 useable row or column lines.

Programmable circuit 3 permanently indicates the defective column line. In a preferred embodiment of the present invention, programmable circuit 3 employs a plurality of fuse elements for indicating the previously-discovered defective column line. Programmable circuit 3 includes fuse circuit 4 and fuse address decode circuit 5 for decoding the address of the defective column line programmably indicated by fuse circuit 4.

Fuse circuit 4 is employed to selectively generate an encoded address corresponding to the defective column line in memory array 10. As shown in FIG. 2, fuse circuit 4 includes a master enable fuse 41 which must be blown in order for fuse circuit 4 to generate the encoded address of the defective column line. Circuitry associated with master enable fuse 41 includes pull-down device 42 which is activated at or around the time the semiconductor memory device is initialized or reinitialized, such as during a power-up sequence. In the event master enable fuse 41 has been blown, activation of pull-down device 42 pulls node n1 (FIG. 2) to a low reference voltage level, and inverter 43 and corresponding pull-down device 44 form a latch element which maintains node n1 at the low reference voltage level. Active low signal EN is thereby asserted to enable the generation of the address of the previously-discovered defective column line.

Alternatively, in the event master fuse 41 has not been blown, master fuse 41 maintains node n1 in a logic high state during initial activation of pull-down transistor 42 and thereafter. Enable signal EN is driven to a high logic level, thereby disabling the generation of a defective column line address.

Fuse circuit 4 further includes circuitry for selectively programming each bit of an encoded address corresponding to a defective column line. Similar to the circuitry associated with master enable fuse 41, programmable address circuitry 45 for each encoded address bit includes a fuse 41', initially-activated pull-down device 42', inverter 43' and corresponding pull-down device 44'. Each programmable address circuit 45 generates a logical true encoded address bit AT and a logical complement encoded address bit AC. It is understood that the number of programmable address circuits 45 in fuse circuit 4 is dependent upon the size and configuration of the corresponding memory array 10, and that p programmable address circuits 45 are utilized as shown in FIG. 2 to generate p-bit wide encoded address signals AT0–ATp and AC0–ACp.

Assuming master enable fuse 41 has been blown so that active low enable signal EN is at a logic low level, a blown fuse 41' of a programmable address circuit 45 results in the corresponding logical true encoded address bit AT being driven to a logic low level and corresponding logical complement encoded address bit AC being driven to a logic high level. Alternatively, an unblown fuse 41' results in the corresponding logical true encoded address bit AT being driven to a logic high level and corresponding logical complement encoded address bit AC being driven to a logic low level. As a result, fuse circuit 4 is capable of selectively generating an encoded address indicating the defective column line, represented by address signals AT0–ATp and AC0–ACp.

It is understood that shifter circuit 2 may be implemented to shift address values which are higher than the address value corresponding to a defective column line either one or two column lines higher based upon the whether the defective column line is an even or odd numbered column line. This implementation preserves the bit line pairing in memory array 10.

Fuse address decode circuit 5 of programmable circuit 3 preferably decodes the encoded address programmed by fuse circuit 4 for use in bypassing the defective column line indicated thereby. Fuse address decode circuit 5 preferably receives logical true encoded address signals AT and logical complement encoded address signals AC, and generates a plurality of decoded fuse address signals for input to shifter circuit 2.

Programmable circuit 3 may include two or more fuse circuits 4A and 4B (FIG. 1) and corresponding fuse address decode circuits 5 so that the present invention is capable of indicating and bypassing two or more column lines associated with defects.

Redundancy circuit 1 is adapted for use in a semiconductor memory device having an input memory address bus which is decoded by address decoder 6. Typically, output signal lines from address decoder 6 are each directly mapped to a distinct row or column line of memory array 10 to activate a single row or column line during execution of a memory read or write operation. In the preferred embodiment of the present invention, shifter circuit 2 preferably receives the decoded address lines generated by address decoder 6 and activates a column line based upon the decoded address lines generated by programmable circuit 3. Shifter circuit 2 modifies the initial address mapping between the output signal lines of address decoder 6 and the column lines so that the defective column line, indicated by programmable circuit 3, is bypassed and a redundant column line is utilized.

Shifter circuit 2 shifts the addressing assignments for the column lines such that the defective column line is no longer assigned an address value. The address value initially mapped to the defective column line is instead mapped by shifter circuit 2 to the adjacent column line having the next higher address value initially mapped thereto. Each address value which is higher than the address value indicated by programmable circuit 3 is similarly shifted or mapped to the column line initially mapped to the next higher address value. The highest address value is mapped to the first redundant column line. The address values which are less than the address value indicated by programmable circuit 3 are not shifted or remapped. In this way, the defective column line is bypassed.

FIG. 3 illustrates a schematic diagram of one preferred implementation of shifter circuit 2 corresponding to a few column lines of memory array 10, namely column lines n−2, n−1, n and n+1. For each fuse circuit 4 and corresponding fuse decode circuit 5, only one decoded fuse address line is asserted following programming of fuse circuit 4. Shifter circuit 2 includes mapping logic which maps the output lines of address decoder 6 to the column lines based upon the decoded fuse address lines. As can be seen, shifter circuit 2 is implemented such that if more than one column line is associated with a defect, then the defective column line having the lesser address value is indicated by fuse circuit 4A. Fuse circuit 4B is programmed to indicate the defective column line associated with the larger address value. Shifter circuit 2 utilizes a ripple architecture such that a decoded fuse address line which is generated by fuse circuit 4A or 4B and corresponds to a particular column line controls the enablement of decoded address lines from address decoder 6 associated with that particular column line as well as higher numbered column lines, as explained below. For each column line, the decoded fuse address lines may selectively enable one of two or more decoded address lines from address decoder 6.

Figure 4:
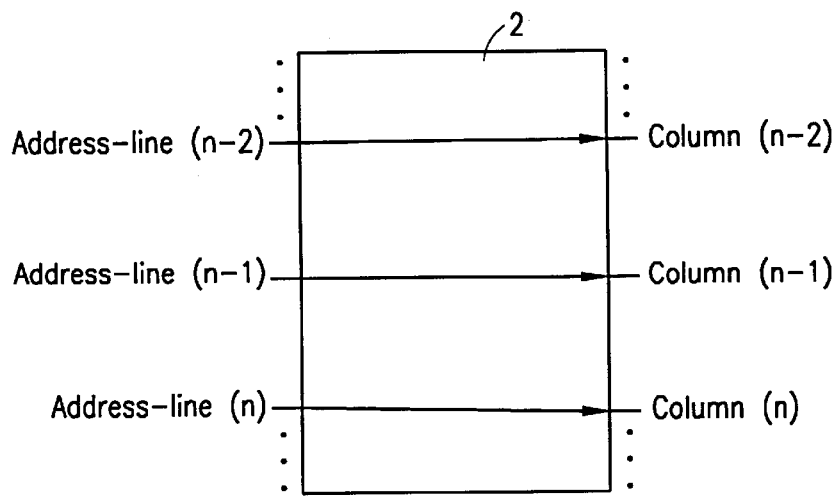
FIGS. 4–7 are diagrams illustrating the mapping of a decoded address lines to memory row or column lines of a memory device.

For example, in the event that column lines 1 to n were defect-free, fuse circuit 4 would not be programmed to indicate any of columns 1 to n as having a defect. As a result, the decoded fuse address lines FA-A(n−2), FA-A(n−1), FA-An, FA-B(n−1), and FA-B(n) would be in a non-asserted (logic low) state. Consequently, the gates which correspond to performing a single shifting operation (gates 34 and 36) and a double shifting operation (gates 35 and 37) are disabled so that their respective address decode lines cannot drive the column lines. Further, gate 33 is enabled due to fuse-generated address lines FA-A(n−2), FA-A(n−3), . . . FA(1) being non-asserted, so that Address-line(n−2) drives column line n−2. Gate 32 is enabled due to fuse-generated address lines FA-A(n−1), FA-A(n−2), FA-A(n−3), . . . FA(1) being nonasserted, so that Address-line(n−1) drives column line n−1. Gate 31 is enabled due to fuse-generated address lines FA-A(n), FA-A(n−1), FA-A(n−2), . . . FA(1) being non-asserted, so that Address-line(n) drives column line n. In other words, failing to indicate any defective column line results in each column line being mapped to their respective default address lines. The mapping of decoded address lines generated by address decoder 6 to the column lines for this situation is illustrated in FIG. 4.

Figure 5:
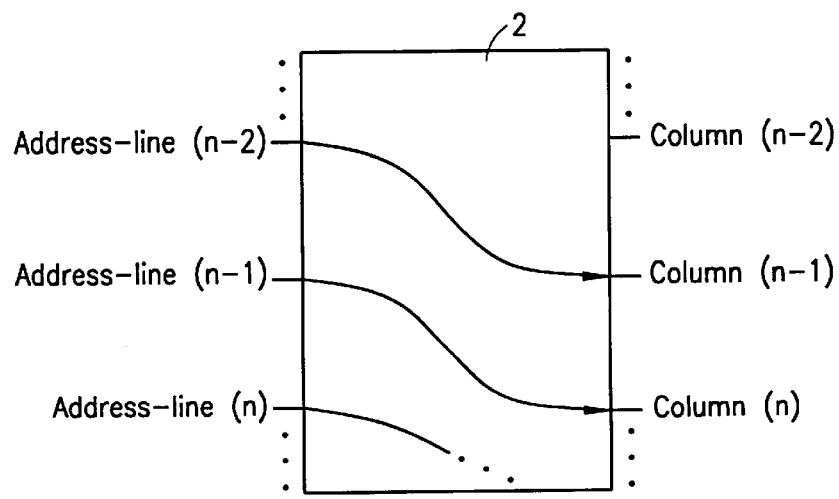

Moreover, in the event that only column n−2 contained a defect, fuse circuit 4 would be programmed to indicate column line n−2 as having a defect. As a result, the fuse-generated address line FA-A(n−2) corresponding to column n−2 would be in an asserted state, with the remaining decoded fuse address lines FA-A (generated by fuse circuit 4A) and FA-B (generated by fuse circuit 4B) corresponding to column lines 1 to n−3 and n−1 to n being in a non-asserted state. Due to the ripple architecture of shifter circuit 2, asserted fuse-generated address line FA-A(n−2) disables gates 31–33 from mapping their respective decoded address lines to the column lines. The decoded address lines associated with gates 35 and 37 are also disabled from being mapped to the column lines due to fuse-generated address lines FA-B(1) to FA-B(n) being non-asserted. Consequently, asserted fuse-generated address line FA-A(n−2) and non-asserted fuse-generated address lines FA-B(n−1) to FA-B(1) enable gate 34 so that address-line(n−2) drives column line n−1; and asserted fuse-generated address line FA-A(n−2) and non-asserted fuse-generated address lines FA-B(n) to FA-B(1) enable gate 36 so that decoded address line Address-line (n−1) drives column n. In other words, indicating column line n−2 as having at defect results in column line n−2 being bypassed and decoded address lines Address-line(n−2), Address-line(n−1) and Address-line(n) being shifted to the next higher column line. The mapping of address decode lines generated by address decoder 6 to the column lines for this situation is illustrated in FIG. 5.

Figure 6:
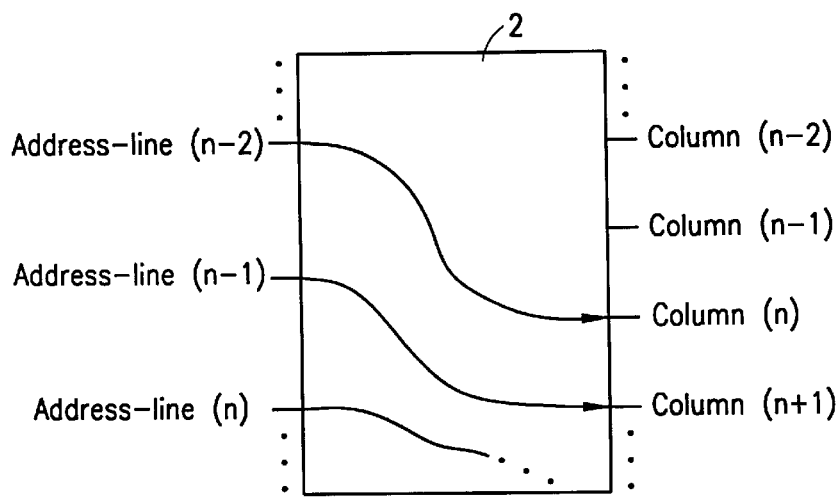

Still further, in the event that only columns n−2 and n−1 each contain a defect, fuse circuits 4A and 4B would be programmed to indicate column lines n−2 and n−1, respectively, as having a defect. As a result, the decoded fuse-generated address lines FA-A(n−2) and FA-B(n−1) corresponding to column lines n−2 and n−1, respectively, would be in an asserted state, with the remaining decoded fuse-generated address lines being in a non-asserted state. Due to the ripple architecture of shifter circuit 2, asserted fuse-generated address line FA-A(n−2) disables gates 31–33 from mapping their respective decoded address lines to the column lines, and asserted fuse-generated address line FA-B (n−1) disables gates 34 and 36 from mapping their respective decoded address lines to the column lines. Consequently, gate 35 is enabled due to FA-B(n−1) being asserted, so that Address-line(n−2) drives column line n; and gate 37 is also enabled due to FA-B(n−1) being asserted, so that addressline(n−1) drives column n+1. In other words, indicating column lines n−2 and n−1 as having a defect results in column lines n−2 and n−1 being bypassed and decoded address lines Address-line(n−2) to Address-line(n) each being shifted or mapped to column lines which were initially mapped to two higher address values. The mapping of decoded address lines generated by address decode logic 6 to the column lines for this situation is illustrated in FIG. 6.

Figure 7:
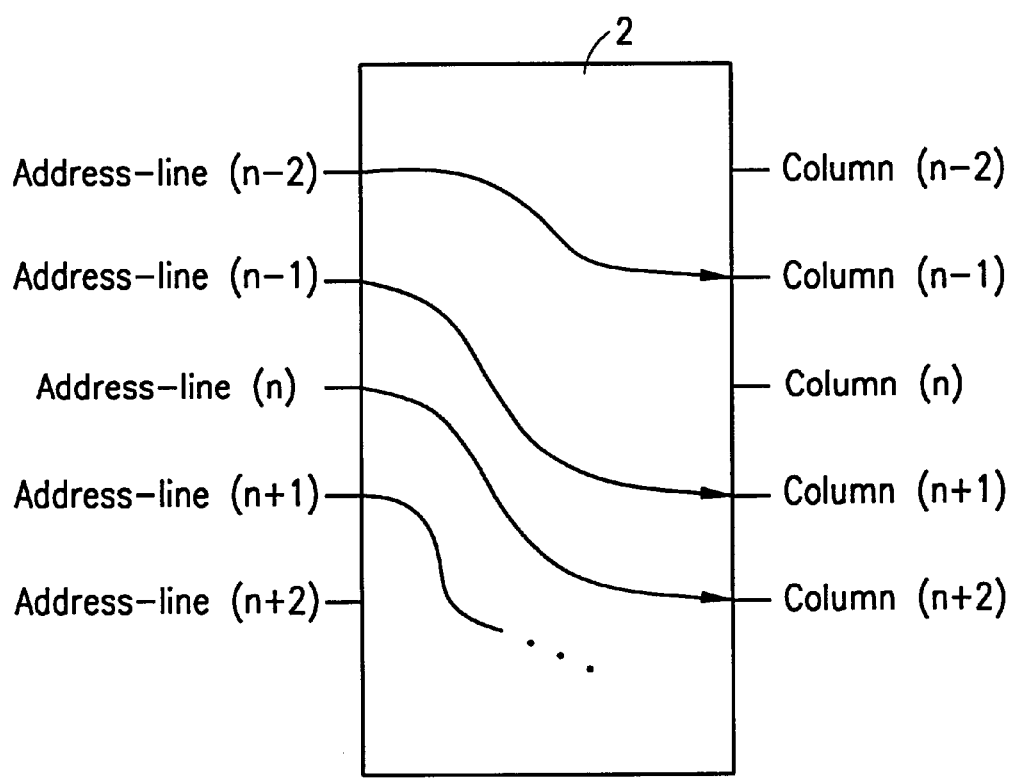

In the event that only columns n−2 and n were found to contain a defect, fuse circuits 4A and 4B would be programmed to indicate column lines n−2 and n, respectively, as having a defect. The resulting decoded fuse address lines FA-A(n−2) (generated by fuse circuit 4A) and FA-B(n) (generated by fuse circuit 4B) corresponding to column lines n−2 and n, respectively, would be in an asserted state, with the remaining decoded fuse address lines being in a non-asserted state. Due to the ripple architecture of shifter circuit 2, asserted fuse-generated address line FA-A(n−2) disables gates 31–33 from mapping their respective decoded address lines to the column lines; and asserted fuse-generated address line FA-B(n) disables gate 36 from mapping decoded address line Address-line (n−1) to the column line n. Gate 35 is also disabled due to fuse-generated address line FA-B(n−1) being non-asserted. Consequently, gate 34 is enabled due to FA-A(n−2) being asserted and FA-B(1) to FA-B(n−1) being non-asserted, so that decoded Address-line (n−2) drives column line n−1. Gate 37 is enabled due to FA-B(n) being asserted, so that decoded Address-line(n−1) drives column line n+1. In other words, for each column line between column lines n−2 and n (column line n−1 in this example), shifter circuit 2 maps a decoded address line thereto (Address-line(n−2)) which is one less than the decoded address line initially mapped thereto. Further, for each column line following column line n, shifter circuit 2 maps a decoded address line thereto which is two less than the decoded address line initially mapped thereto. The mapping of decoded address lines generated by address decode logic 6 to the column lines for this situation is illustrated in FIG. 7.

As shown in FIG. 3, one preferred implementation of shifter circuit 2 employs NAND gates and inverters for performing the ripple shifting operation. It is understood that shifter circuit 2 may be implemented in other ways to perform the shifting operation. For instance, shifter circuit 2 may employ transmission gates to perform the shifting operation. In this implementation, the transmission gates would effectively replace gates 31–37 of FIG. 3 and would eliminate the need for the NAND gates which drive each of the column lines.

A primary benefit of the present invention is that the fuse elements 41 and 41' are not closely tied in pitch to the column lines of memory array 10. As a result, the layout of the fuse elements do not conflict or otherwise interfere with the layout of the memory array 10. In addition, less fuse elements are needed in the present fuse circuit 4 than fuses needed in conventional redundancy architectures.

In a first preferred embodiment of the present invention described above, the decoded fuse address lines (generated by fuse address decode circuits 5) are static so that an entire column or row line associated with at least one defect is permanently bypassed. In a second preferred embodiment of the present invention, the decoded fuse-generated address lines are dynamic in order to bypass a column line only when a previously discovered defective memory cell is to be accessed.

Figure 8:
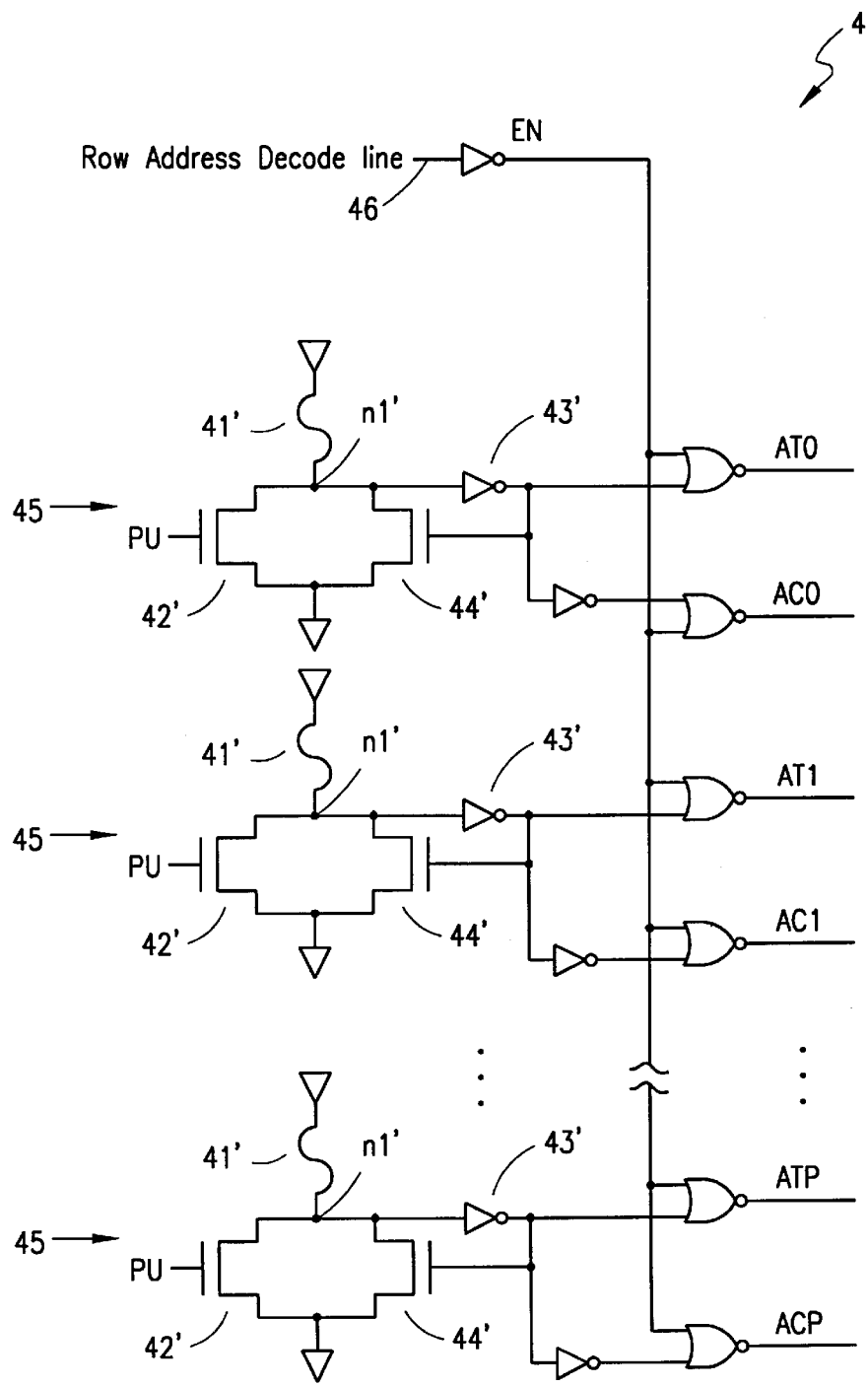
FIG. 8 is a schematic diagram of a fuse circuit according to another preferred embodiment of the present invention.

According to the second preferred embodiment of the present invention, the master fuse enable circuitry in fuse circuitry 4 is replaced by enabling circuitry controlled by the decoded row address line 46 corresponding to the defective memory cell. Referring to FIG. 8, fuse circuit 4 dynamically asserts master enable signal EN when the decoded row address line corresponding to the defective memory cell is asserted. Consequently, shifter circuit 2 will only shift or remap the column lines when the row address and column address (previously programmed using fuse elements 41') indicate the particular defective memory cell. This second embodiment is advantageous in that a single redundant column line may be used to bypass defective memory cells having different column addresses.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Redundant circuitry for a memory device including a memory cell array having a plurality of memory row/column lines, each memory row/column line being initially mapped to a distinct address value, the redundant circuitry comprising:

programmable circuitry for indicating a first address value corresponding to a first memory row/column line associated with a defect, and a second address corresponding to a second memory row/column line associated with a defect; and shifter circuitry, responsive to the programmable circuitry, for remapping the first address value and address values which are greater than the first address value each to a distinct memory row/column line in the memory cell array initially mapped to another address value relative to the corresponding remapped address value, and remapping at least one third address value which is greater than the second address value to a memory row/column line initially mapped to an address value which was higher relative to the third address value.

2. The redundant circuitry of claim 1, wherein:
the programmable circuitry includes fuse circuitry, the fuse circuitry being selectively programmed to indicate the first address value.

3. The redundant circuitry of claim 2, wherein:
the fuse circuitry includes fuse elements which are selectively blowable; and
the programmable circuitry includes decode logic for decoding the first address value based upon the fuse elements blown in the fuse circuitry.

4. The redundant circuitry of claim 2, wherein:
the first address value corresponds to a first memory column line associated with a defective memory cell; and
the fuse circuitry indicates the first address value based upon a row address line associated with the defective memory cell being asserted.

5. The redundant circuitry of claim 1, wherein:
the shifter circuitry remaps the first address value to a memory row/column line initially mapped to an immediately higher address value.

6. The redundant circuitry of claim 5, wherein:
the shifter circuitry remaps each address value which is greater than the first address value to a memory row/column line initially mapped to an immediately higher address value.

7. The redundant circuitry of claim 1, wherein:
the memory device generates a plurality of decoded address lines;
for at least one of the memory row/column lines, the shifter circuitry enables one of two or more of the decoded address lines for driving the memory row/column line, based upon the indicated first address value.

8. The redundant circuitry of claim 6, wherein:
the memory device generates a plurality of decoded address lines;
for each of the memory row/column lines, the shifter circuitry enables at least zero of the decoded address lines for driving the memory row/column line, based upon the indicated first address value.

9. The redundant circuitry of claim 8, wherein:
the shifter circuitry for each memory line selectively enables the decoded address lines for driving the memory row/column line based upon the first address value generated by the programmable circuitry, the decoded address lines for each memory row/column line corresponding to consecutively numbered address values.

10. The redundant circuitry of claim 1, wherein:
the shifter circuitry remaps the at least one third address value to a memory row/column line initially mapped to an address value which was two higher relative to the third address value.

11. The redundant circuitry of claim 1, wherein:
the shifter circuitry remaps at least one fourth address value which is greater than the first address value and less than the second address value, to a memory row/column line initially mapped to an address value immediately higher than the fourth address value.

12. The redundant circuitry of claim 11, wherein:
the memory device generates a plurality of decoded address signals;
the shifter circuitry, for each memory row/column line, enables the decoded address signals for driving the memory row/column line based upon the first address value and the second address value generated by the programmable circuitry, the decoded address signals for each memory row/column line corresponding to consecutively numbered address values.

13. Redundant circuitry for a memory device having a plurality of addressable memory lines and a plurality of address values mappable to the addressable memory lines, the redundant circuitry comprising:
a first circuit for selectively indicating a first address value corresponding to a first memory line having a defect associated therewith, and a second address value, greater than the first address value, corresponding to a second memory line having a defect associated therewith; and
a second circuit, responsive to the first circuit, for mapping the first address value to a memory line initially mapped to a higher address value relative thereto, and for at least one memory line in the memory array, mapping one of a plurality of address values to the at least one memory line based upon the first address value and the second address value indicated by the first circuit.

14. The redundant circuitry of claim 13, wherein:
for each memory line initially mapped to an address value which is greater than the first address value and less than the second address value, the second circuit maps an address value to the memory line which is one less than the address value initially mapped thereto.

15. The redundant circuitry of claim 14, wherein:
for each memory line initially mapped to an address value which is greater than the second address value, the second circuit maps an address value to the memory line which is two less than the address value initially mapped thereto.

16. The redundant circuitry of claim 13, wherein:
the memory device includes a plurality of decoded address lines; and
for each memory line in the memory array, the second circuit enables zero or more decoded address lines for driving the memory line based upon the first address value.

17. The redundant circuitry of claim 13, wherein:
the memory device includes a plurality of decoded address lines; and
for at least one memory line in the memory array, the second circuit enables one of a plurality of decoded address lines for driving the memory line based upon the first address value.

18. The redundant circuitry of claim 13, wherein:
the first address value corresponds to a first memory column line associated with a defective memory cell; and
the second circuit indicates the first address value based upon a row address line associated with the defective memory cell being asserted.

19. Redundant circuitry for a memory device having a plurality of addressable memory lines and a plurality of address values mappable to the addressable memory lines, the redundant circuitry comprising:
a first circuit for indicating a first address value corresponding to a first memory line having a defect associated therewith; and
a second circuit, responsive to the first circuit, for mapping the first address value to a memory line initially mapped to a higher address value relative thereto;
the first circuit indicates a second address value, greater than the first address value, corresponding to a second memory line having a defect associated therewith;
the memory device includes a plurality of decoded address lines; and
for each memory line in the memory array, the second circuit includes selection logic for enabling zero or more decoded address lines for driving the memory line based upon the first address value and the second address value.

20. Redundant circuitry for a memory device having a plurality of addressable memory lines and a plurality of address values mappable to the addressable memory lines, the redundant circuitry comprising:
a first circuit for indicating a first address value corresponding to a first memory line having a defect associated therewith; and
a second circuit, responsive to the first circuit, for mapping the first address value to a memory line initially mapped to a higher address value relative thereto;
the first circuit indicates a second address value, greater than the first address value, corresponding to a second memory line having a defect associated therewith;
the memory device includes a plurality of decoded address lines; and
for at least one memory line in the memory array, the second circuit enables one of a plurality of decoded address lines for driving the memory line based upon the first address value and the second address value.

21. A method of replacing at least one memory line of a memory device which is associated with a defect, comprising the steps of:
indicating within the memory device a first address value corresponding to a first memory line associated with a defect, and a second address value corresponding to a second memory line associated with a defect; and
mapping within the memory device the first address value to a memory line initially mapped to a higher address value relative to the first address value, and the second address value to a memory line initially mapped to an address value which is greater than the second address value.

22. The method of claim 21, further including the step of:

for each memory line initially mapped to an address value which is greater than the first address value, mapping an address value to the memory line which is one less than the address value initially mapped thereto.

23. The method of claim 21, further including the step of:

for each memory line initially mapped to an address value which is greater than the first address value and less than the second address value, mapping an address value to the memory line which is one less than the address value initially mapped thereto.

24. The method of claim 23, further including the step of:

for each memory line initially mapped to an address value which is greater than the second address value, mapping an address value to the memory line which is two less than the address value initially mapped thereto.

25. The method of claim 21, wherein:

the memory device includes a plurality of decoded address lines; and for each memory line in the memory array, the method further includes the step of enabling zero or more decoded address lines for driving the memory line based upon the first address value.

26. The method of claim 21, wherein:

the memory device includes a plurality of decoded address lines; and for at least one memory line in the memory array, the method further includes the step of enabling one of a plurality of the decoded address lines for driving the memory line based upon the first address value.

27. A method of replacing at least one memory line of a memory device which is associated with a defect, the memory device including a plurality of decoded address lines, the method comprising the steps of:

indicating within the memory device a first address value corresponding to a first memory line associated with a defect;

mapping within the memory device the first address value to a memory line initially mapped to a higher address value relative thereto;

indicating a second address value, greater than the first address value, corresponding to a second memory line associated with a defect; and for each memory line in the memory array, enabling zero or more decoded address lines for driving the memory line based upon the first address value and the second address value.

28. A method of replacing at least one memory line of a memory device which is associated with a defect, the memory device including a plurality of decoded address lines, the method comprising the steps of:

indicating within the memory device a first address value corresponding to a first memory line associated with a defect;

mapping within the memory device the first address value to a memory line initially mapped to a higher address value relative thereto;

indicating a second address value, greater than the first address value, corresponding to a second memory line associated with a defect; and for at least one memory line in the memory array, enabling one decoded address line for driving the memory line based upon the first address value and the second address value.

29. Redundant circuitry for a memory device having a plurality of addressable memory lines and a plurality of address values capable of being mapped to the addressable memory lines, the redundant circuitry comprising:

a first circuit for selectively providing one or more address values corresponding to one or more memory lines having a defect; and a second circuit for mapping at least one addressable memory line to any of at least three address values, based upon the one or more address values provided by the first circuit.

* * * * *